(12) United States Patent
Harashima

(10) Patent No.: US 10,550,491 B2
(45) Date of Patent: Feb. 4, 2020

(54) FILM-FORMING APPARATUS

(71) Applicant: TOKYO ELECTRON LIMITED, Tokyo (JP)

(72) Inventor: Masayuki Harashima, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/527,631

(22) PCT Filed: Nov. 9, 2015

(86) PCT No.: PCT/JP2015/081488
§ 371 (c)(1),
(2) Date: May 17, 2017

(87) PCT Pub. No.: WO2016/080230
PCT Pub. Date: May 26, 2016

(65) Prior Publication Data
US 2017/0321346 A1    Nov. 9, 2017

(30) Foreign Application Priority Data
Nov. 21, 2014  (JP) .................................. 2014-236363

(51) Int. Cl.
*C30B 25/10*        (2006.01)
*C23C 16/46*        (2006.01)
(Continued)

(52) U.S. Cl.
CPC .............. *C30B 25/10* (2013.01); *C23C 16/46* (2013.01); *C23C 16/481* (2013.01); *H01L 21/205* (2013.01)

(58) Field of Classification Search
CPC ........ C23C 16/46; C23C 16/481; C30B 25/10
See application file for complete search history.

(56) References Cited

U.S. PATENT DOCUMENTS

| 5,978,202 A * | 11/1999 | Wadensweiler .... H01L 21/6833 279/128 |
| 2006/0144336 A1 | 7/2006 | Um |
| 2010/0092666 A1* | 4/2010 | Morisaki ............... C23C 16/325 427/248.1 |

FOREIGN PATENT DOCUMENTS

| EP | 2037485 A1 | 3/2009 |
| JP | 2008-159947 A | 7/2008 |

(Continued)

OTHER PUBLICATIONS

International Search Report dated Feb. 9, 2016 corresponding to application No. PCT/JP2015/081488.

*Primary Examiner* — Aiden Lee
(74) *Attorney, Agent, or Firm* — Nath, Goldberg & Meyer; Jerald L. Meyer

(57) ABSTRACT

In a film-forming apparatus, a rotary shaft is connected to a rotary stage. A plurality of wafers are placed in a plurality of placement regions arranged in a circumferential direction with respect to a central axis line of the rotary shaft and is held by the rotary stage. The rotary stage is accommodated in an internal space of a susceptor. In this internal space, a gas supply mechanism generates a process gas flow along a direction orthogonal to the axis line from the outside of the rotary stage. A heat insulating material is installed in a heat insulating region in the internal space of the susceptor. The heat insulating region is located more outwardly from the axis line than positions in the placement regions nearest to the central axis line and more inwardly from the central axis line than positions in the placement regions farthest from the axis line.

6 Claims, 8 Drawing Sheets

(51) Int. Cl.
*C23C 16/48* (2006.01)
*H01L 21/205* (2006.01)

(56) References Cited

FOREIGN PATENT DOCUMENTS

| | | |
|---|---|---|
| JP | 2009-212506 A | 9/2009 |
| JP | 2014-027028 A | 2/2014 |
| JP | 2014-144880 A | 8/2014 |

\* cited by examiner

FILM-FORMING APPARATUS

This is a National Phase Application filed under 35 U.S.C. 371 as a national stage of PCT/JP2015/081488, filed Nov. 9, 2015, an application claiming the benefit of Japanese Application No. 2014-236363, filed Nov. 21, 2014, the content of each of which is hereby incorporated by reference in its entirety.

TECHNICAL FIELD

The present disclosure relates to a film-forming apparatus.

BACKGROUND

In recent years, silicon carbide (SiC) has been used for electronic devices such as semiconductor power devices or the like. In the manufacture of such electronic devices, a process of forming a SiC film on a SiC substrate by an epitaxial growth is performed.

In the aforementioned process, a semi-batch type film-forming apparatus having better throughput than a single wafer type film-forming apparatus may be used. Semi-batch type film-forming apparatuses are described in documents such as, for example, Japanese laid-open publication No. 2014-27028, Japanese laid-open publication No. 2008-159947 and the like.

Among the above documents, the film-forming apparatus described in Japanese laid-open publication No. 2008-159947 includes a rotary shaft, a rotary stage, a susceptor, a container, a heat insulating material and a gas supply mechanism. The rotary stage is coupled to the rotary shaft. A holder is mounted on the rotary stage. The holder provides a plurality of placement regions on which a plurality of wafers is placed. The holder is mounted on the rotary stage so that the plurality of placement regions is arranged in a circumferential direction with respect to a central axis line of the rotary shaft. The susceptor has a rectangular tube shape and accommodates the rotary stage in its internal space. The susceptor is adapted to be heated by induction heating. The container accommodates the susceptor. The heat insulating material is installed between the susceptor and the container. The gas supply mechanism is configured to form a process gas flow in a direction orthogonal to the rotary shaft from outside of the rotary stage.

PRIOR ART DOCUMENTS

Patent Documents

Patent Document 1: Japanese laid-open publication No. 2014-27028
Patent Document 2: Japanese laid-open publication No. 2008-159947

In the epitaxial growth of a SiC film, film formation is performed by introducing p-type or n-type impurities into the SiC film. Particularly, in the case of p-type, the concentration of impurities introduced into the SiC film becomes higher in a region where a wafer in-plane temperature is low, and becomes lower in a region where the wafer in-plane temperature is high. Therefore, in order to suppress variations in impurity concentration in the wafer plane, it is necessary to reduce variations in temperature in the wafer plane during film formation. However, from the viewpoint of reducing variations in wafer temperature, additional improvements are needed for the above-described conventional semi-batch type film-forming apparatus.

SUMMARY

According to one embodiment of the present disclosure, there is installed a semi-batch type film-forming apparatus. The film-forming apparatus includes a rotary shaft, a rotary stage, a susceptor, a gas supply mechanism, a container, a first heat insulating material and a second heat insulating material. The rotary stage is connected to the rotary shaft. The rotary stage is configured to hold a plurality of wafers. The plurality of wafers is respectively placed in a plurality of placement regions disposed in a circumferential direction with respect to a central axis line of the rotary shaft. The susceptor is configured to accommodate the rotary stage in an internal space thereof. The gas supply mechanism is configured to generate a flow of a process gas along a direction orthogonal to the central axis line from the outside of the rotary stage in the internal space. The container is configured to accommodate the susceptor. The first heat insulating material is installed between the container and the susceptor so as to cover the susceptor. The second heat insulating material is installed in the internal space provided by the susceptor. The second heat insulating material is installed in a heat insulating region located more outward with respect to the central axis line than positions in the plurality of placement regions nearest to the central axis line and more inward with respect to the central axis line than positions in the plurality of placement regions farthest from the central axis line.

In the film-forming apparatus according to one embodiment, the rotary shaft is connected to the rotary stage. Therefore, the susceptor does not exist in a region where the rotary shaft extends. Accordingly, heat generated from the susceptor is less likely to be radiated to a region inside the wafer close to the central axis line. The heat tends to be deprived from the region. Furthermore, in the film-forming apparatus, the process gas is supplied from outside the rotary stage in the direction orthogonal to the central axis line. Therefore, the heat in a region inside the wafer far from the central axis line tends to be deprived by the process gas. For that reason, in the film-forming apparatus, the second heat insulating material is installed in the above-described heat insulating region. During a film formation, a temperature of the wafer in an intermediate region between the region close to the central axis line and the region far from the central axis line is reduced by the second heat insulating material. Accordingly, it is possible to reduce variations in temperature in the plane of the wafer.

In one embodiment, the rotary stage may include a first surface on which the plurality of wafers is held and a second surface opposite the first surface. The second heat insulating material may be installed between the second surface and the susceptor. It is desirable that the amount of heat radiated from a wafer holding member to the wafer is as small as possible in order to prevent contamination of the wafer (in particular, deposits on the wafer) by a substance constituting the wafer holding member. In this embodiment, since the second heat insulating material is installed between the susceptor and the second surface of the rotary stage, the amount of heat radiated to the wafer holding member is reduced. Accordingly, it is possible to suppress contamination of the wafer.

In one embodiment, the second heat insulating material may have an annular plate-like shape extending in the heat insulating region. Alternatively, a plurality of second heat insulating materials may be distributed in the heat insulating region. In addition, the second heat insulating material may partially extend outside the heat insulating region.

In one embodiment, the film-forming apparatus may further include a holder mounted on the rotary stage. The holder may be configured to provide the plurality of placement regions.

As described above, it is possible to reduce variations in temperature in the wafer plane in the semi-batch type film-forming apparatus.

DETAILED DESCRIPTION

Figure 1:
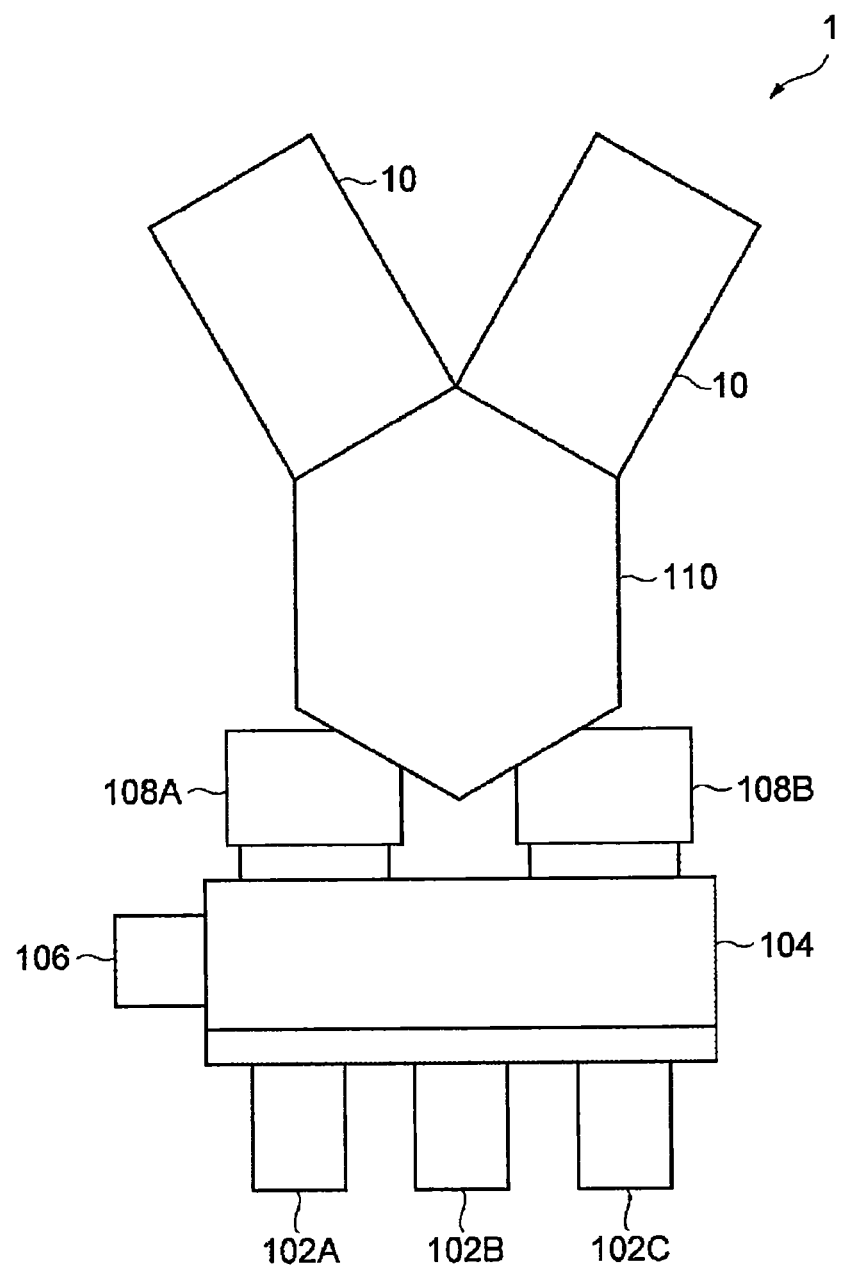
FIG. 1 is a view showing a film-forming system according to one embodiment.

Embodiments of the present disclosure will now be in detail described in detail with reference to the accompanying drawings. In the drawings, the same or corresponding parts are designated by like reference numerals.

First, a film-forming system including a film-forming apparatus according to one embodiment will be described. FIG. 1 is a view showing a film-forming system according to one embodiment. The film-forming system 1 shown in FIG. 1 includes ports 102A to 102C, a loader module 104, an alignment mechanism 106, load lock chambers 108A and 108B, a transfer module 110, and film-forming apparatuses 10 according to one embodiment.

Each of the ports 102A to 102C accommodates a holder to be described later. As described later, a plurality of wafers is mounted on the holder. The ports 102A to 102C are connected to the loader module 104.

The loader module 104 includes a chamber and a transfer device installed inside the chamber. The transfer device of the loader module 104 takes out the holder accommodated in one of the ports 102A to 102C and transfers the holder thus taken-out to one of the load lock chambers 108A and 108B. Before being transferred to the load lock chamber 108A or 108B, the holder may be sent to the alignment mechanism 106 and may be aligned by the alignment mechanism 106.

The load lock chambers 108A and 108B provide preliminary depressurization chambers. The holder transferred by the transfer device of the loader module 104 is accommodated in any one of the preliminary depressurization chambers of the load lock chambers 108A and 108B.

The transfer module 110 is connected to the load lock chambers 108A and 108B. The transfer module 110 includes a depressurizable chamber and a transfer device installed inside the chamber. The transfer device of the transfer module 110 includes a transfer arm. The transfer arm takes out the holder accommodated in the preliminary depressurization chamber of the load lock chamber 108A or 108B and transfers the same to the film-forming apparatus 10.

Figure 2:
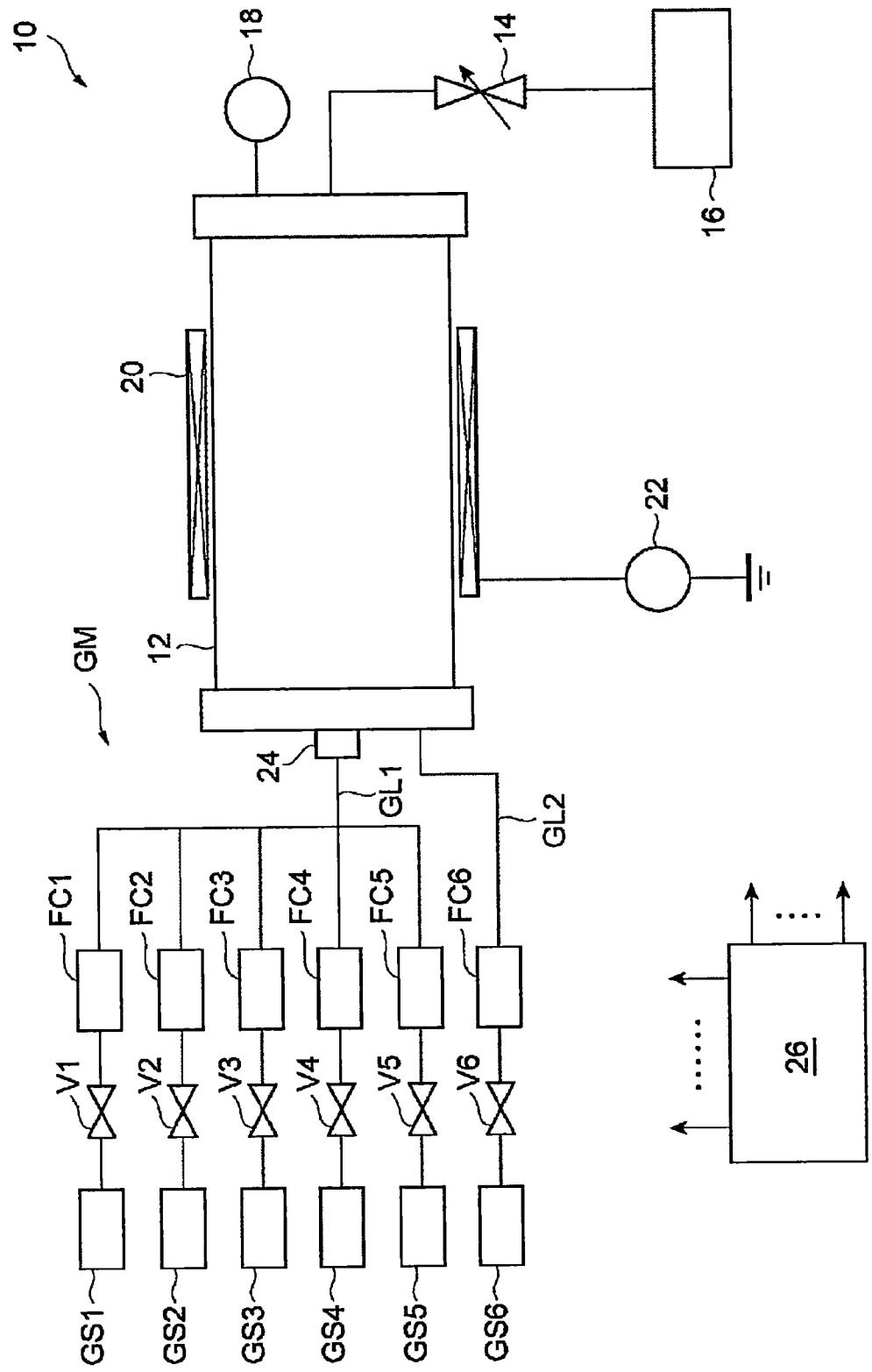
FIG. 2 is a view schematically showing a film-forming apparatus according to one embodiment.

Hereinafter, the film-forming apparatus 10 according to one embodiment will be described. FIG. 2 is a view schematically showing the film-forming apparatus according to one embodiment. As shown in FIG. 2, the film-forming apparatus 10 includes a container 12. The container 12 is a box-shaped container having a substantially rectangular parallelepiped outer shape and provides therein a depressurizable space S (see FIG. 3).

An exhaust device 16 is connected to the container 12 via a pressure regulator 14. The exhaust device 16 is, for example, a vacuum pump. The internal space S of the container 12 is depressurized by the exhaust device 16. A pressure gauge 18 is connected to the container 12. The pressure gauge 18 measures the pressure in the internal space of the container 12. The pressure regulator 14 operates to regulate the pressure in the internal space of the container 12 based on a pressure measurement value measured by the pressure gauge 18.

A coil 20 is installed around the container 12. The coil 20 is connected to a high-frequency power source 22. When the high frequency power is supplied from the high frequency power source 22 to the coil 20, the susceptor to be described later is heated by induction heating.

The film-forming apparatus 10 further includes a gas supply mechanism GM. The gas supply mechanism GM includes valves V1 to V6, flow rate controllers FC1 to FC6, a gas line GL1, a gas line GL2, and a gas supplier 24. The valves V1 to V6 are connected to gas sources GS1 to GS6, respectively. The gas source GS1 is a source of a raw material gas containing silicon, for example, a source of a $SiH_4$ gas. The gas source GS2 is a source of a carbon-containing gas, for example, a source of a $C_3H_8$ gas. The gas source GS3 is a source of a carrier gas, for example, a source of a $H_2$ gas. The gas source GS4 is a source of a gas containing a p-type impurity, for example, a source of a TMA (trimethylaluminum) gas. The gas source GS5 is a source of a gas containing an n-type impurity, for example, a source of a $N_2$ gas. The gas source GS6 is a source of a cooling gas, for example, a source of a noble gas such as an Ar gas or the like.

The valves V1 to V6 are connected to the flow rate controllers FC1 to FC6, respectively. The flow rate controllers FC1 to FC6 are mass flow controllers or pressure control type flow rate controllers. The flow rate controllers FC1 to FC5 are connected to a common gas line GL1. The gas line GL1 is connected to the gas supplier 24. The gas supplier 24 supplies a process gas to a below-described film formation space S1 (see FIG. 3) of the space S provided by the container 12.

The flow rate controller FC6 is connected to the gas line GL2. The gas line GL2 supplies a cooling gas to a below-described space S2 (see FIG. 3) of the space S provided by the container 12.

The film-forming apparatus 10 may further include a controller 26. The controller 26 may include a CPU, a memory device, an input device such as a keyboard or the like, a display part, and a communication device. In the memory device, there is stored a program, i.e., a recipe, for controlling the respective parts of the film-forming apparatus 10 in respective steps of a film forming process performed in the film-forming apparatus 10. The CPU operates in accordance with the program and sends control signals to the respective parts of the film formation apparatus 10 via the communication device. By such control of the controller 26, for example, the valves V1 to V6, the flow rate controllers FC1 to FC6, the high frequency power source 22, the pressure regulator 14, the exhaust device 16 and the like are controlled. In addition, a driving device for rotary stage, which will be described later, is also controlled.

Figure 3:
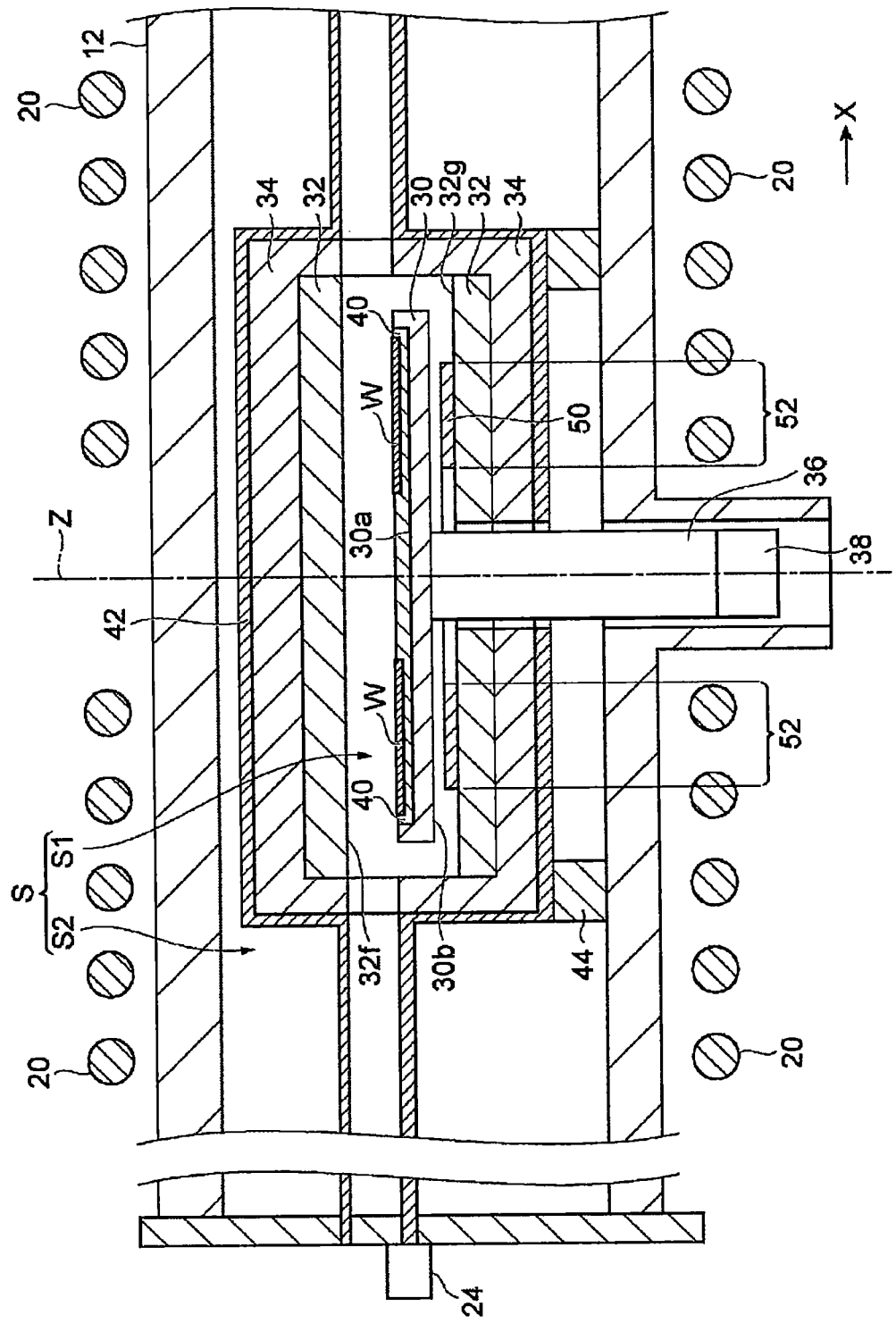
FIG. 3 is a sectional view showing an internal structure of a container of the film-forming apparatus shown in FIG. 2.

Hereinafter, an internal structure of the container 12 of the film-forming apparatus 10 will be described with reference to FIG. 3. FIG. 3 is a sectional view showing the internal structure of the container of the film-forming apparatus shown in FIG. 2. As shown in FIG. 3, the film-forming apparatus 10 includes a rotary stage 30, a susceptor 32 and a first heat insulating material 34, which are disposed inside the container 12. The film-forming apparatus 10 further includes a rotary shaft 36.

The rotary stage 30 is configured to hold a plurality of wafers W and to rotate the wafers W around a central axis line Z. In one embodiment, the rotary stage 30 has a substantially disk-like shape. The rotary stage 30 may be, for example, a graphite-made member coated with SiC or a member made of polycrystalline SiC. The rotary shaft 36 is connected to the center of the rotary stage 30. The rotary shaft 36 has a substantially columnar shape and extends in the vertical direction, namely in a direction in which the central axis line Z extends. The central axis line Z is the central axis line of the rotary shaft 36. The rotary shaft 36 is connected to a driving device 38. The driving device 38 generates power for rotating the rotary shaft 36 about the central axis line Z and rotates the rotary stage 30 about the central axis line Z.

In one embodiment, the rotary stage 30 includes a first surface 30a and a second surface 30b which are opposed to each other. The first surface 30a is an upper surface of the rotary stage 30. The second surface 30b is a surface opposite the first surface 30a, namely a lower surface of the rotary stage 30. The wafers W are held on the first surface 30a. In one embodiment, the wafers W are placed on the holder 40, and the holder 40 is mounted on the rotary stage 30.

Figure 4:
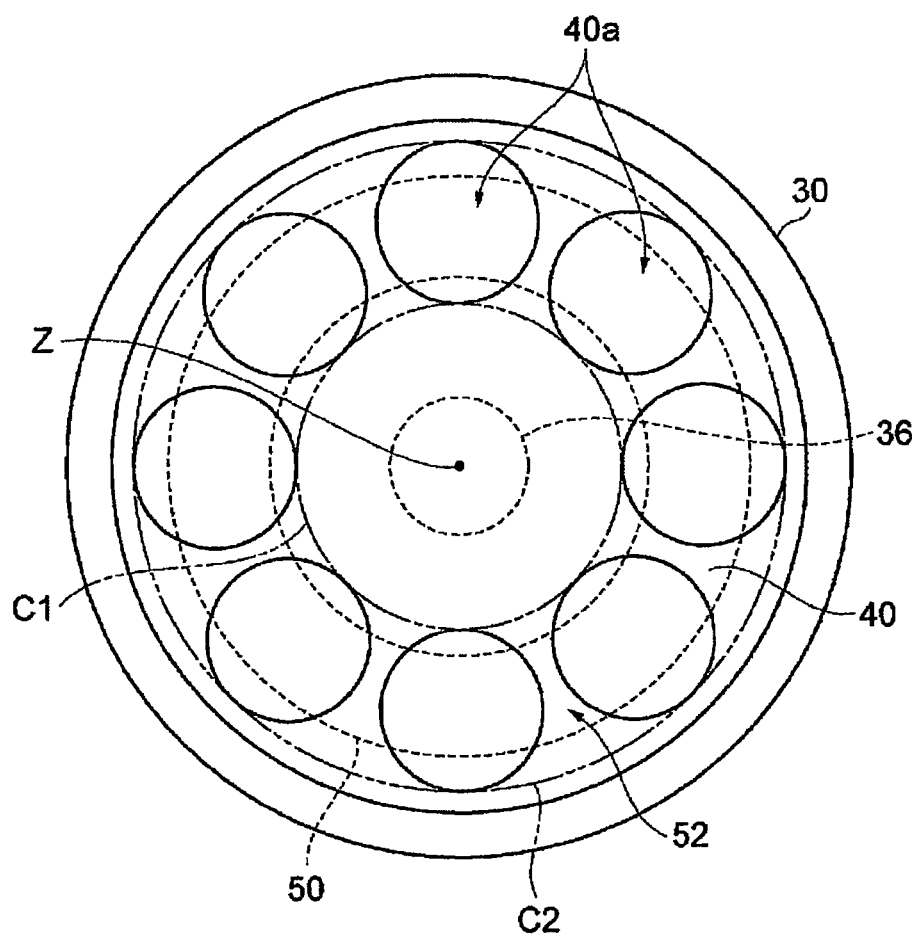
FIG. 4 is a plan view showing a holder and a rotary stage shown in FIG. 3.

FIG. 4 is a top plan view showing the holder and the rotary stage shown in FIG. 3. As shown in FIGS. 3 and 4, the holder 40 is a member having a substantially disk-like shape and may be, for example, a graphite-made member coated with SiC or a member made of polycrystalline SiC. In one embodiment, the first surface 30a of the rotary stage 30 defines a circular recess extending in the circumferential direction about the central axis line Z. The holder 40 is fitted into the recess.

An upper surface of the holder 40 provides a plurality of placement regions 40a on which the wafers W are placed, respectively. The plurality of placement regions 40a is arranged in the circumferential direction with respect to the center of the holder 40. Therefore, in a state in which the holder 40 is placed on the rotary stage 30, the placement regions 40a and the wafers W are aligned in the circumferential direction with respect to the central axis line Z. In FIG. 4, the number of the placement regions 40a is 8. However, the number of placement regions 40a may be any arbitrary number equal to or larger than 2.

In one embodiment, each of the placement regions 40a may be a surface of the holder 40 defining the recess. The recess has a circular planar shape having a diameter somewhat larger than the diameter of the wafers W. In this embodiment, the plurality of wafers W is fitted into the respective recesses provided by the holder 40 and is placed on the respective placement regions 40a. The wafers W held by the rotary stage 30 in this way are rotated in the circumferential direction with respect to the central axis line Z during the film formation with the rotation of the rotary stage 30 attributable to the rotation of the rotary shaft 36.

Figure 5:
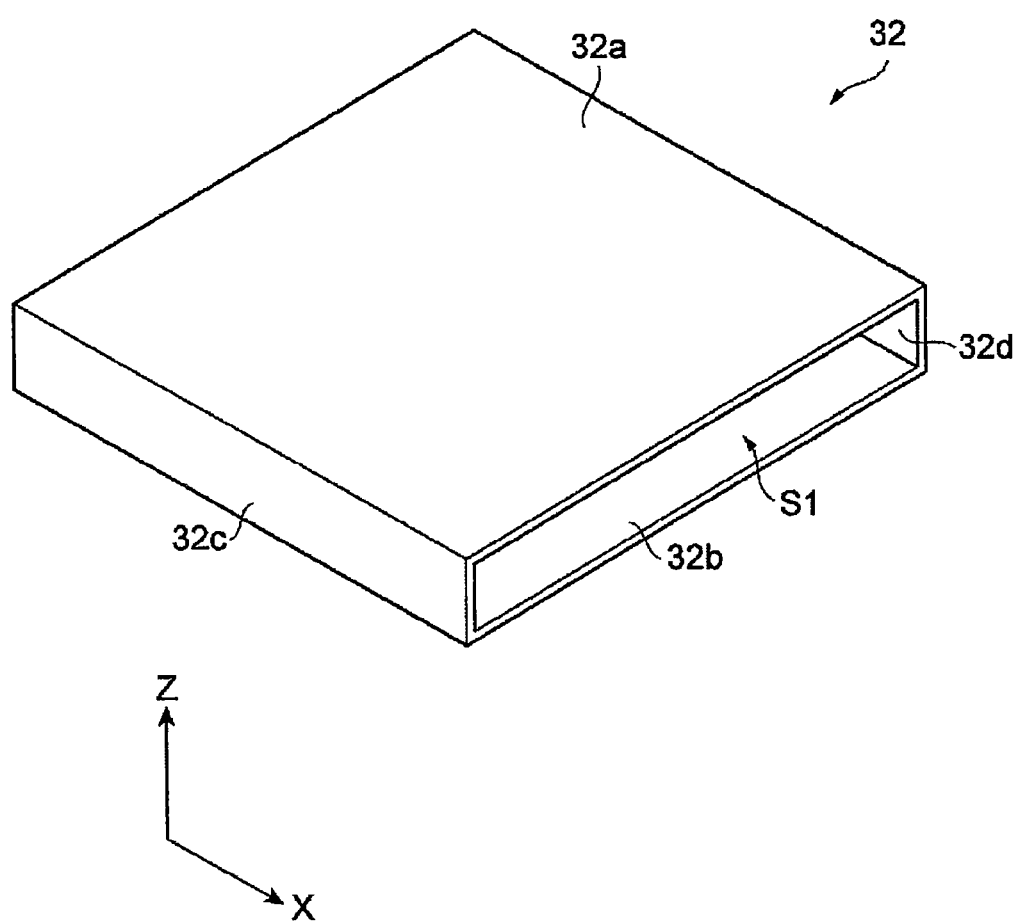
FIG. 5 is a perspective view of a susceptor shown in FIG. 3.

The rotary stage 30 is accommodated in the internal space of the susceptor 32, namely in the film formation space S1 provided by the susceptor 32. FIG. 5 is a perspective view of the susceptor shown in FIG. 3. The susceptor 32 is a substantially rectangular tubular member. The susceptor 32 provides openings at both ends in the X direction orthogonal to the central axis line Z. The susceptor 32 may be composed of, for example, graphite coated with SiC.

Specifically, the susceptor 32 includes a pair of wall portions 32a and 32b and a pair of wall portions 32c and 32d. The pair of wall portions 32a and 32b has a substantially flat plate-like shape and face each other. The wall portion 32a faces the first surface 30a of the rotary stage 30, and the wall portion 32b faces the second surface 30b of the rotary stage 30. The pair of wall portions 32c and 32d faces each other and extend in the direction intersecting the pair of wall portions 32a and 32b. The pair of wall portions 32c and 32d is connected to edge portions of the pair of wall portions 32a and 32b.

The susceptor 32 is heated with induction heating caused by the coil 20. When the susceptor 32 is heated, the rotary stage 30, the holder 40, and the wafers W are heated by radiant heat radiated from the susceptor 32 or the like. That is to say, the susceptor 32 is configured to heat the rotary stage 30, the holder 40 and the wafers W from four sides.

The susceptor 32 is covered with the first heat insulating material 34. In one embodiment, the first heat insulating material 34 has a substantially box-like shape extending along the outer surface of the susceptor 32 and provides openings continuously extending from the openings of the susceptor 32 at both ends in the X direction. The first heat insulating material 34 has a thermal conductivity lower than that of the susceptor 32. For example, the first heat insulating material 34 may be made of graphite. However, the density of a carbon material constituting the first heat insulating material 34 is lower than the density of a carbon material constituting the susceptor 32. Therefore, the first heat insulating material 34 may be made of, for example, carbon fibers. The first heat insulating material 34 is interposed between the susceptor 32 and the container 12 to inhibit the radiation of heat from the susceptor 32 to the container 12 and to allow the heat from the susceptor 32 to be radiated toward the rotary stage 30, the holder 40 and the wafers W. As a result, it is possible to efficiently heat the wafers W.

The first heat insulating material 34 is covered with a holding member 42. That is to say, the holding member 42 provides a space for accommodating the rotary stage 30, the susceptor 32 and the first heat insulating material 34. This space is defined to extend in the X direction. Furthermore, the holding member 42 is opened at both ends in the X direction and provides a path leading to the space S1. The holding member 42 may be made of, for example, quartz. The holding member 42 is supported on the inner surface of the container 12 via a columnar support portion 44. The space S2 described above is defined between the holding member 42 and the container 12. The cooling gas is supplied to the space S2 as described above.

The above-described gas supplier 24 is attached to one open end of the holding member 42 in the X direction. The gas supplier 24 generates a flow of the process gas moving in the X direction inside the film formation space S1. That is to say, the gas supplier 24 generates a flow of the process gas moving in the X direction from the outside of the rotary stage 30 and in the direction extending along surfaces of the wafers W on which films are formed. In one embodiment, the gas supplier 24 provides a plurality of gas outlets arranged in the direction in which the central axis line Z extends and in the direction orthogonal to the X direction. As shown in FIG. 3, the gas supplier 24 is arranged to face a lower portion of the opening provided by the holding member 42. An upper portion of the opening is adapted to allow the transfer arm of the transfer module 110 described above to pass therethrough when the holder 40 is transferred to the space S1.

Through-holes through which the rotary shaft 36 passes are formed in the susceptor 32, the first heat insulating material 34 and the holding member 42. A sealing portion such as a magnetic fluid seal or the like may be installed around the rotary shaft 36 so that the process gas supplied to the space S1 does not leak out from the through-holes. A hole through which the rotary shaft 36 passes is also formed in the container 12. A sealing portion such as a magnetic fluid seal or the like may be installed between the rotary shaft 36 and the container 12 so that the gas supplied to the space S2 does not leak out from the hole.

As shown in FIG. 3, the film-forming apparatus 10 further includes a second heat insulating material 50. The second heat insulating material 50 has a thermal conductivity lower than that of the susceptor 32. For example, the second heat insulating material 50 may be made of graphite. However, the density of a carbon material constituting the second heat insulating material 50 is lower than the density of a carbon material constituting the susceptor 32. Therefore, the second heat insulating material 50 may be made of, for example, carbon fibers.

The second heat insulating material 50 is installed in a heat insulating region 52. This heat insulating region 52 is a region existing in the internal space of the susceptor 32. That is to say, the heat insulating region 52 is positioned between an upper inner surface 32f and a lower inner surface 32g of the susceptor 32. Furthermore, the heat insulating region 52 is located more outward with respect to the central axis line Z than the positions in the placement regions 40a nearest to the central axis line Z and more inward with respect to the central axis line Z than the positions in the placement regions 40a farthest from the central axis line Z. In other words, the heat insulating region 52 is located more outward with respect to the central axis line Z than the positions having the shortest distance in the radial direction from the central axis line Z among all the positions in the placement regions 40a and more inward with respect to the central axis line Z than the positions having the largest distance in the radial direction from the central axis line Z among all the positions in the placement regions 40a. In FIG. 4, a circle C1 having a radius of the aforementioned shortest distance is drawn about the central axis line Z, and a circle C2 having a radius of the aforementioned largest distance is drawn about the central axis line Z. As shown in FIG. 4, the heat insulating region 52 is an annular region existing more outward than the circle C1 and more inward than the circle C2 with respect to the central axis line Z.

In one embodiment, the second heat insulating material 50 has a substantially annular plate-like shape and is installed between the second surface 30b of the rotary stage 30 and the lower inner surface 32g of the susceptor 32. In a more specific example, the second heat insulating material 50 is installed on the lower inner surface 32g of the susceptor 32.

In the film-forming apparatus 10, when epitaxially growing SiC on each of the wafers W, the rotary stage 30 holding the wafers W is rotated. In addition, the susceptor 32 is heated by the induction heating caused by the coil 20, and the wafers W are heated by the radiation heat from the susceptor 32. For example, the wafers W are heated to a temperature of about 1600 degrees C. Furthermore, the process gas is supplied from the gas supplier 24 of the gas supply mechanism GM into the space S1 in the X direction. The process gas includes, for example, a $SiH_4$ gas, a $C_3H_8$ gas and a $H_2$ gas. When a p-type impurity is introduced into the epitaxial growth film, the process gas may further include, for example, a TMA gas. Alternatively, when an n-type impurity is introduced into the epitaxial growth film, the process gas may further include, for example, a $N_2$ gas. By such a film forming process, an SiC epitaxial growth film is formed on each of the wafers W.

In the film-forming apparatus 10, the rotary shaft 36 is connected to the center of the rotary stage 30. Therefore, the susceptor 32 does not exist in a region where the rotary shaft 36 extends. Accordingly, the heat generated from the susceptor 32 is less likely to be radiated to the region inside the wafer W close to the central axis line Z. The heat tends to be deprived from the region. Furthermore, the process gas is supplied from outside the rotary stage 30 in a direction orthogonal to the central axis line Z, namely in the X direction. Therefore, the heat in the region inside the wafer W far from the central axis line Z tends to be deprived by the process gas. For that reason, the second heat insulating material 50 is installed in the above-described heat insulating region 52.

Figure 6:
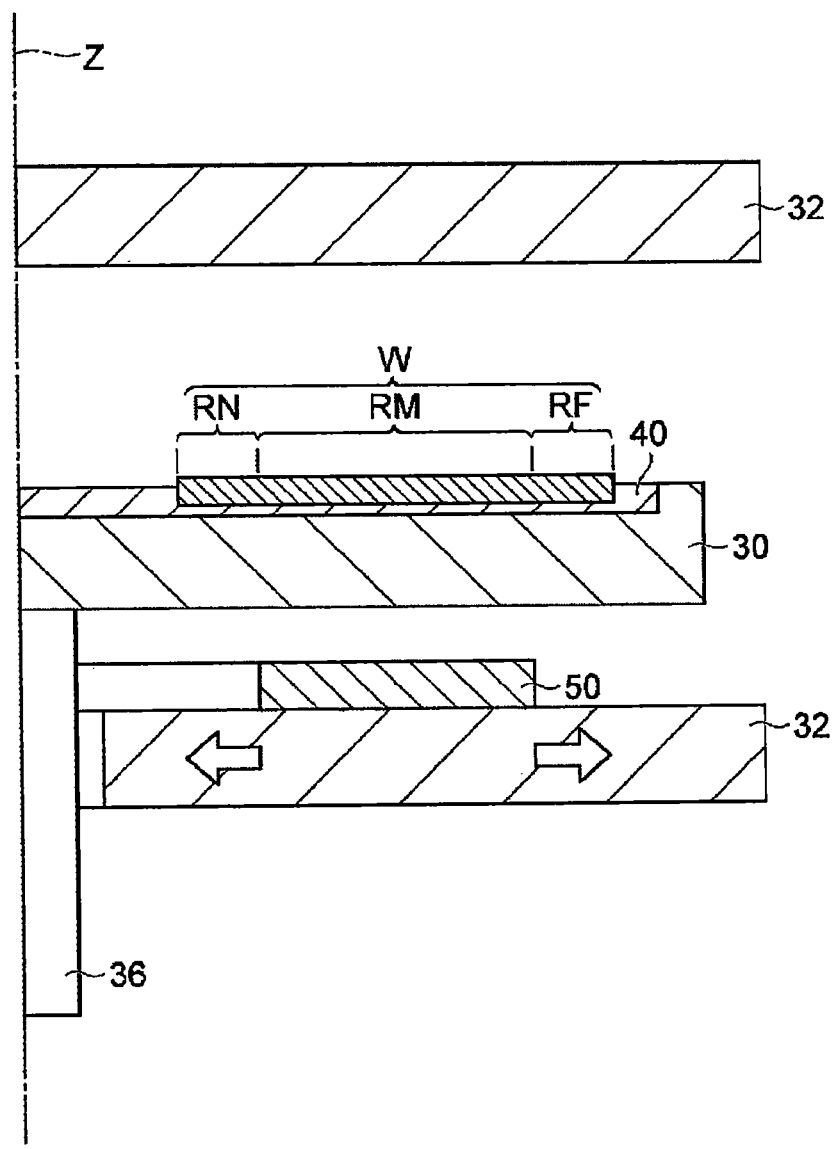
FIG. 6 is a view schematically showing a susceptor, a rotary stage, and a second heat insulating material of the film-forming apparatus shown in FIG. 3.

FIG. 6 is a view schematically showing the susceptor 32, the rotary stage 30 and the second heat insulating material 50 of the film-forming apparatus shown in FIG. 3. In FIG. 6, only the portions of the susceptor 32, the rotary stage 30 and the second heat insulating material 50 existing at one side of the central axis line Z are shown. As shown in FIG. 6, the second heat insulating material 50 inhibits the heat of the susceptor 32 from being radiated to an intermediate region RM between a region RN in the wafer W close to the central axis line Z and a region RF in the wafer W far from the central axis line Z. Accordingly, during the film formation, the temperature of the wafer W in the intermediate region RM is lowered by the second heat insulating material 50. The heat inhibited by the second heat insulating material 50 is radiated through the susceptor 32 as indicated by arrows in FIG. 6. Accordingly, the radiation by the susceptor 32 is increased in portions not covered by the second heat insulating material 50. Thus, the heat radiated to the region RN and the region RF in the wafer W is larger than the heat radiated to the region RM in the wafer W. As a result, variations in temperature in the plane of the wafer W are reduced.

If variations in temperature in the plane of the wafer W during the film formation are reduced, variations in the concentration of impurities introduced in the SiC epitaxial growth film in the plane of the wafer W are reduced. In addition, when variations in temperature in the plane of the wafer W occur, defects such as triangular defects or the like attributable to abnormal nucleation may occur in the low temperature region in the wafer W. However, according to the film-forming apparatus 10, the heat radiated to the region RN and the region RF of the wafer W, which tend to become low in temperature, is increased, thus reducing variations in temperature in the plane of the wafer W. This suppresses the occurrence of such defects.

In one embodiment, the second heat insulating material 50 is installed between the second surface 30b of the rotary stage 30 and the susceptor 32. In this regard, it is desirable that the amount of heat radiated from the holder 40 to the wafer W is as small as possible in order to prevent contamination of the wafer W by a substance constituting the holder 40. In this embodiment, since the second heat insulating material 50 is installed between the second surface 30b of the rotary stage 30 and the susceptor 32, the amount of heat radiated to the holder 40 is reduced. Accordingly, it is possible to suppress contamination of the wafer W (in particular, deposits on the wafer W).

Figure 7:
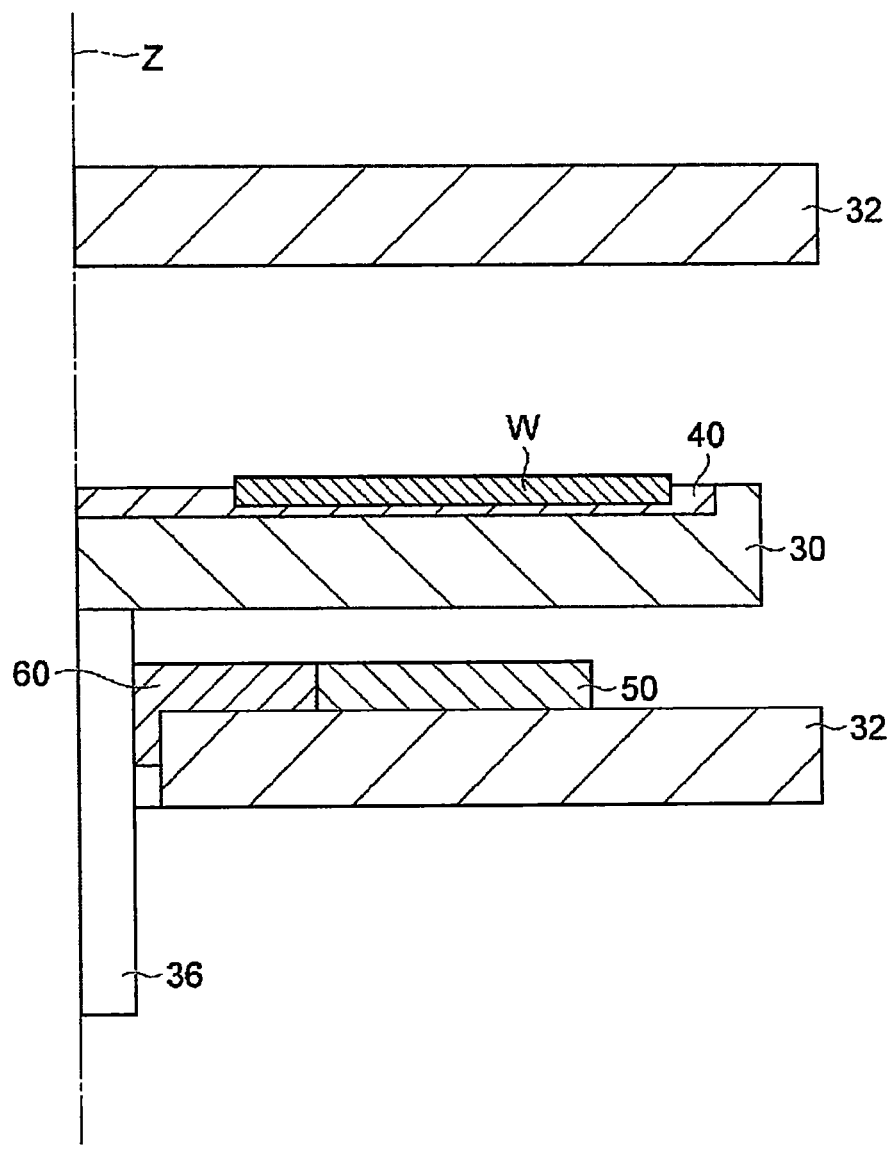
FIG. 7 is a sectional view showing an example of a structure for positioning the second heat insulating material.
Figure 8:
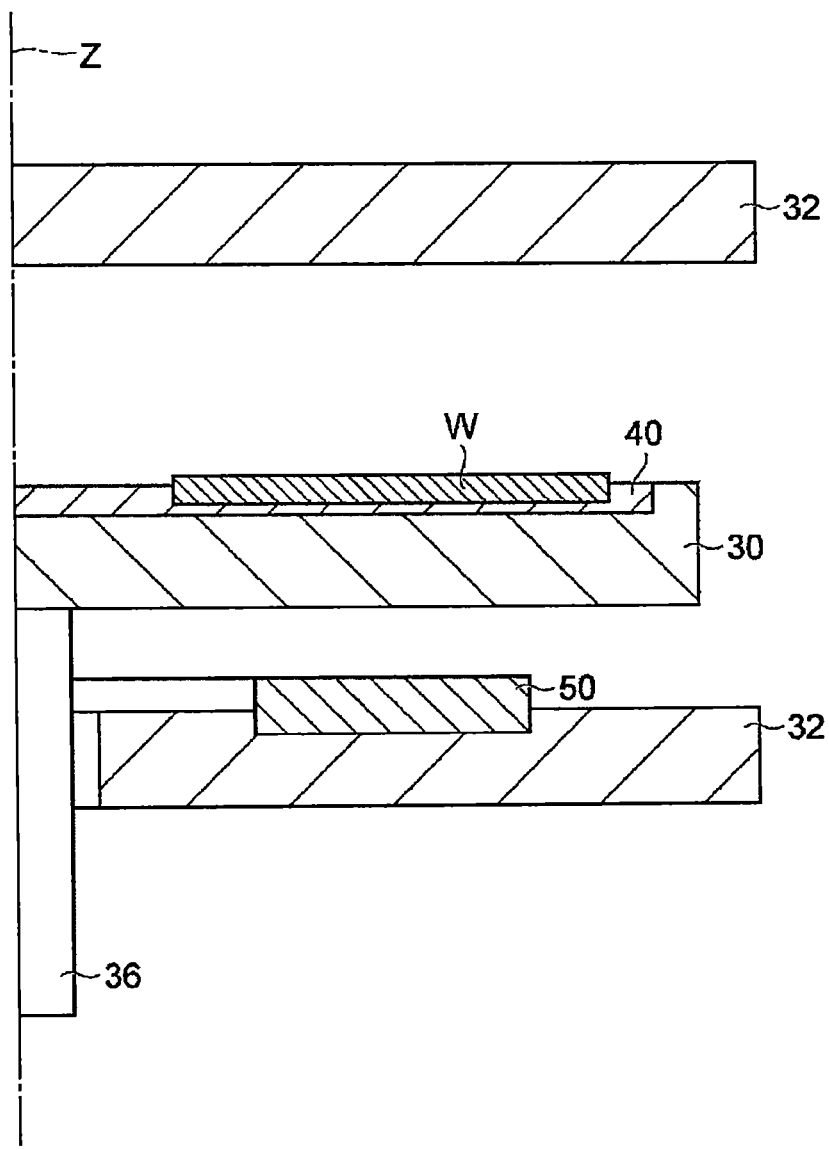
FIG. 8 is a sectional view showing an example of a structure for positioning the second heat insulating material.

While various embodiments have been described above, various modifications can be made without being limited to the above-described embodiments. FIGS. 7 and 8 are sectional views showing an example of a structure for positioning the second heat insulating material. Similar to FIG. 6, FIGS. 7 and 8 schematically show the portions of the susceptor 32, the rotary stage 30 and the second heat insulating material 50 at one side of the central axis line Z. For example, as shown in FIG. 7, it may be possible to adopt a structure in which the second heat insulating material 50 is positioned, by fixing a positioning member 60 to the susceptor 32 and bringing an inner edge of the second heat insulating material 50 into contact with the positioning member 60. As shown in FIG. 7, the positioning member 60 may have an annular plate-like shape having an outer edge in contact with the inner edge of the second heat insulating material 50. However, the present disclosure is not limited thereto. In addition, as shown in FIG. 8, it may be possible to adopt a structure in which a recess is formed in the susceptor 32 and the second heat insulating material 50 is fitted into the recess.

In the example shown in FIG. 3, the second heat insulating material 50 has an annular plate-like shape. Alternatively, a plurality of second heat insulating materials may be distributed in the heat insulating region 52. For example, a plurality of second heat insulating materials may be arranged along the circumferential direction in the heat insulating region 52. In addition, the second heat insulating material may partially extend outside of the heat insulating region 52.

EXPLANATION OF REFERENCE NUMERALS

1: film-forming system, 10: film-forming apparatus, 12: container, 16: exhaust device, 20: coil, 24: gas supplier. 26: controller, 30: rotary stage, 32: susceptor, 34: first heat insulating material, 36: rotary shaft, 38: driving device, 40: holder, 40a: placement regions, 42: holding member, 50: second heat insulating material, 52: heat insulating region, GM: gas supply mechanism, Z: central axis line

What is claimed is:
1. A film-forming apparatus, comprising:
a rotary shaft;
a rotary stage connected to the rotary shaft and configured to hold a plurality of wafers in a plurality of placement regions disposed in a circumferential direction with respect to a central axis line of the rotary shaft, the rotary stage having a first surface on which the plurality of wafers is held and a second surface opposite the first surface;
a susceptor configured to accommodate the rotary stage in an internal space of the susceptor and radiate heat toward the rotary stage through the internal space, the internal space being defined by an upper inner surface of the susceptor facing the first surface of the rotary stage, a lower inner surface of the susceptor facing the second surface of the rotary stage, and sidewall surfaces of the susceptor;
a gas supply mechanism configured to generate a flow of a process gas along a direction orthogonal to the central axis line from the outside of the rotary stage in the internal space;
a container configured to accommodate the susceptor;
a first heat insulating material installed between the container and the susceptor so as to cover the susceptor;
a second heat insulating material installed in the internal space and configured to cover a portion of the lower inner surface of the susceptor so as to allow the susceptor to radiate a larger amount of heat in a remaining portion of the lower inner surface of the susceptor than in the portion covered by the second heat insulating material, the portion covered by the second heat insulating material being in a heat insulating region located more outward with respect to the central axis line than positions in the plurality of placement regions nearest to the central axis line and more inward with respect to the central axis line than positions in the plurality of placement regions farthest from the central axis line; and
a positioning block fixed to the susceptor and having an edge in contact with the second heat insulating material,
wherein the susceptor is formed of graphite coated with SiC and the second heat insulating material is formed of carbon fibers.

2. The apparatus of claim 1, wherein the second heat insulating material has an annular plate-like shape extending in the heat insulating region.

3. The apparatus of claim 1, further comprising:
a holder mounted on the rotary stage,
wherein the holder is configured to provide the plurality of placement regions.

4. The apparatus of claim 1, wherein the second heat insulating material is distanced from the rotary stage.

5. The apparatus of claim 4, wherein the amount of heat radiated by the susceptor is set such that the plurality of wafers held by the rotary stage is heated to 1600 degrees C.

6. The apparatus of claim 1, wherein a thermal conductivity of the second heat insulating material is lower than that of the susceptor, and a density of the second heat insulating material is lower than that of the susceptor.

* * * * *